(12) United States Patent
Lee et al.

(10) Patent No.: US 9,246,083 B2
(45) Date of Patent: Jan. 26, 2016

(54) MEMORY DEVICES AND METHODS OF FABRICATING THE SAME

(71) Applicant: Samsung Electronics Co., Ltd., Suwon-Si, Gyeonggi-Do (KR)

(72) Inventors: Kilho Lee, Hwaseong-si (KR); Ki Joon Kim, Hwaseong-si (KR); Se Woong Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 14/498,465

(22) Filed: Sep. 26, 2014

(65) Prior Publication Data

US 2015/0017743 A1 Jan. 15, 2015

Related U.S. Application Data

(63) Continuation of application No. 13/686,212, filed on Nov. 27, 2012, now Pat. No. 8,872,270.

(30) Foreign Application Priority Data

Feb. 29, 2012 (KR) .......................... 10-2012-0021056

(51) Int. Cl.
*H01L 21/8238* (2006.01)
*H01L 43/12* (2006.01)
*H01L 29/82* (2006.01)
*H01L 27/108* (2006.01)
*H01L 27/22* (2006.01)

(52) U.S. Cl.
CPC .......... *H01L 43/12* (2013.01); *H01L 27/10888* (2013.01); *H01L 27/222* (2013.01); *H01L 27/228* (2013.01); *H01L 29/82* (2013.01)

(58) Field of Classification Search
CPC .................................. H01L 28/90; H01L 43/12
USPC ............................................ 257/932; 438/199
See application file for complete search history.

(56) References Cited

U.S. PATENT DOCUMENTS

| | | | |
|---|---|---|---|
| 5,661,063 A | 8/1997 | Lee | |
| 6,590,244 B2 | 7/2003 | Asao et al. | |
| 7,473,646 B2 | 1/2009 | Shiraiwa et al. | |
| 7,539,253 B2 | 5/2009 | Li et al. | |
| 8,026,547 B2 | 9/2011 | Kim | |
| 2001/0005058 A1* | 6/2001 | Asano et al. ................. | 257/775 |
| 2002/0135018 A1 | 9/2002 | Hidaka | |
| 2002/0140060 A1 | 10/2002 | Asao et al. | |
| 2007/0026684 A1 | 2/2007 | Parascandola et al. | |
| 2007/0285974 A1 | 12/2007 | Takemura et al. | |
| 2009/0072289 A1* | 3/2009 | Kim et al. .................... | 257/298 |

(Continued)

FOREIGN PATENT DOCUMENTS

| | | | |
|---|---|---|---|
| JP | 2004266204 A | 9/2004 | |
| JP | 2004274016 A | 9/2004 | |
| JP | 2005072491 A | 3/2005 | |
| KR | 10-0359781 B1 | 5/2002 | |
| KR | 10-0386455 B1 | 6/2003 | |

*Primary Examiner* — Ajay K Arora
(74) *Attorney, Agent, or Firm* — Harness, Dickey & Pierce (57) ABSTRACT

Memory devices and methods of fabricating the same include a substrate including a cell region and a peripheral circuit region, data storages on the cell region, first bit lines on and coupled to the data storages, first contacts coupled to peripheral transistors on the peripheral circuit region, and second bit lines on and coupled to the first contacts. The second bit lines may each have a lowermost surface lower than a lowermost surface of the data storages.

13 Claims, 9 Drawing Sheets

(56) References Cited

U.S. PATENT DOCUMENTS

| | | |
|---|---|---|
| 2009/0250743 A1 | 10/2009 | Kim |
| 2009/0296461 A1 | 12/2009 | Kang et al. |
| 2009/0302472 A1 | 12/2009 | Yoon et al. |
| 2011/0195551 A1 | 8/2011 | Kim |
| 2011/0241102 A1 | 10/2011 | Cho et al. |

* cited by examiner

Fig. 10 ations.

MEMORY DEVICES AND METHODS OF FABRICATING THE SAME

CROSS-REFERENCE TO RELATED APPLICATIONS

This application is a continuation of U.S. application Ser. No. 13/686,212 filed on Nov. 27, 2012 and claims priority under 35 U.S.C. §119 to Korean Patent Application No. 10-2012-0021056, filed on Feb. 29, 2012, in the Korean Intellectual Property Office, the entire contents of each of which are hereby incorporated herein by reference.

BACKGROUND OF THE INVENTION

1. Field

Example embodiments relate to semiconductor devices and methods of fabricating the same, and more particularly, to memory devices and methods of fabricating the same.

2. Description of Related Art

Due to their small-sized, multifunctional, and/or low-cost characteristics, semiconductor devices are being esteemed as important elements in the electronic industry. For memory devices storing binary data, higher integration is required to satisfy consumer demands for superior performance and inexpensive prices. To realize the requirement of higher integration, line widths of components constituting the memory devices are becoming narrower.

In addition to the higher integration density, the memory device is required to have high reliability. However, the increase in integration density may deteriorate the reliability of the memory devices, and thus, there have been extensive studies on new technology that provides improved reliability to memory devices.

SUMMARY

Example embodiments relate to semiconductor devices and methods of fabricating the same, and more particularly, to memory devices and methods of fabricating the same.

Example embodiments provide a memory device fabricated through a simplified process and a method of fabricating the same.

According to example embodiments, a memory device may include a substrate including a cell region and a peripheral circuit region, a plurality of data storages on the cell region, a plurality of first bit lines on and coupled to the plurality of data storages, a plurality of first contacts coupled to a plurality of peripheral transistors on the peripheral circuit region, and a plurality of second bit lines on and coupled to the plurality of first contacts. The plurality of second bit lines each have a lowermost surface lower than a lowermost surface of the plurality of data storages.

In example embodiments, the plurality of peripheral transistors may each include a first source/drain region, and the plurality of first contacts may each be connected to the first source/drain region of one of the plurality of peripheral transistors.

In example embodiments, the plurality of second bit lines may each have an uppermost surface at the substantially same level as an uppermost surface of each of the plurality of first bit lines.

In example embodiments, a vertical section of each second bit line may have an aspect ratio of 2.5 or more.

In example embodiments, the plurality of second bit lines may be formed of a copper containing material.

In example embodiments, the device may further include a plurality of cell transistors on the cell region, wherein each of the plurality of cell transistors includes a second source/drain region, and a plurality of second contacts each connected to the second source/drain region of one of the plurality of cell transistors via one of the plurality of data storages. The plurality of second contacts each may have an uppermost surface higher than an uppermost surface of the plurality of first contacts.

In example embodiments, each of the plurality of cell transistors further includes a cell gate electrode, and a third source/drain region spaced apart from the second source/drain region with the cell gate electrode interposed between the second source/drain region and the third source/drain region. The device may further include a conductive plate connecting the third source/drain region of the plurality of cell transistors to each other and covering the cell gate electrode of the plurality of cell transistors.

In example embodiments, the device may further include a plurality of contact line patterns electrically connecting the conductive plate with the third source/drain region of the plurality of cell transistors. The plurality of contact line patterns may extend along the plurality of cell gate electrodes.

In example embodiments, the plurality of second contacts may extend through the conductive plate.

In example embodiments, the device may further include a plurality of insulating spacers each between one of the plurality of second contacts and the conductive plate.

In example embodiments, the plurality of second bit lines may each be 1.5 times or more thicker than each of the plurality of first bit lines.

In example embodiments, each of the plurality of data storages may include a magnetic tunnel junction.

According to example embodiments, a method of fabricating a memory device may include forming a plurality of first contacts connected to a plurality of peripheral transistors on a substrate, forming a plurality of data storages two-dimensionally arranged on a cell region of the substrate, forming an interlayered dielectric covering the plurality of first contacts and the plurality of data storages, patterning the interlayered dielectric to form a plurality of first trenches exposing the data storages, patterning the interlayered dielectric to form a plurality of second trenches exposing the plurality of first contacts, forming a plurality of first bit lines connected to the plurality of data storages in the first trenches, and forming a plurality of second bit lines connected to the plurality of first contacts in the second trenches. The plurality of first trenches and the plurality of second trenches may be formed using different etching processes.

In example embodiments, the plurality of second trenches may each a lowermost surface lower than a lowermost surface of the plurality of data storages.

In example embodiments, the plurality of first and second bit lines may be formed at a process temperature lower than a process temperature used to form the plurality of first contacts.

In example embodiments, forming the plurality of first and second bit lines may include forming a conductive layer filling the plurality of first and second trenches, and performing a planarization process to expose the interlayered dielectric.

According to example embodiments, a method of fabricating a memory device includes forming a first contact electrically connected to a peripheral transistor in a peripheral circuit region of a substrate. A data storage is formed in a cell region of the substrate. An interlayered dielectric layer is formed covering the first contact and the data storage. A first trench exposing the data storage is formed by patterning the interlayered dielectric layer only over the cell region using a first etching process. A second trench exposing the first contact is formed by patterning the interlayered dielectric layer only over the peripheral circuit region using a second etching process. A first bit line is formed connected to the data storage in the first trench. A second bit line is formed contacting the first contact in the second trench.

In example embodiments, the data storage may include a magnetic tunnel junction.

In example embodiments, a lowermost surface of the second bit line contact may be lower than a lowermost surface of the magnetic tunnel junction.

In example embodiments, the method may include providing a cell transistor in the cell region electrically connected to the data storage via a second contact, prior to forming the data storage. The first contact and the second contact may be formed of different materials. The second contact may be formed of a material containing tungsten.

BRIEF DESCRIPTION OF THE DRAWINGS

Example embodiments will be more clearly understood from the following brief description taken in conjunction with the accompanying drawings. FIGS. 1 through 10 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments relate to semiconductor devices and methods of fabricating the same, and more particularly, to memory devices and methods of fabricating the same.

Figure 1:
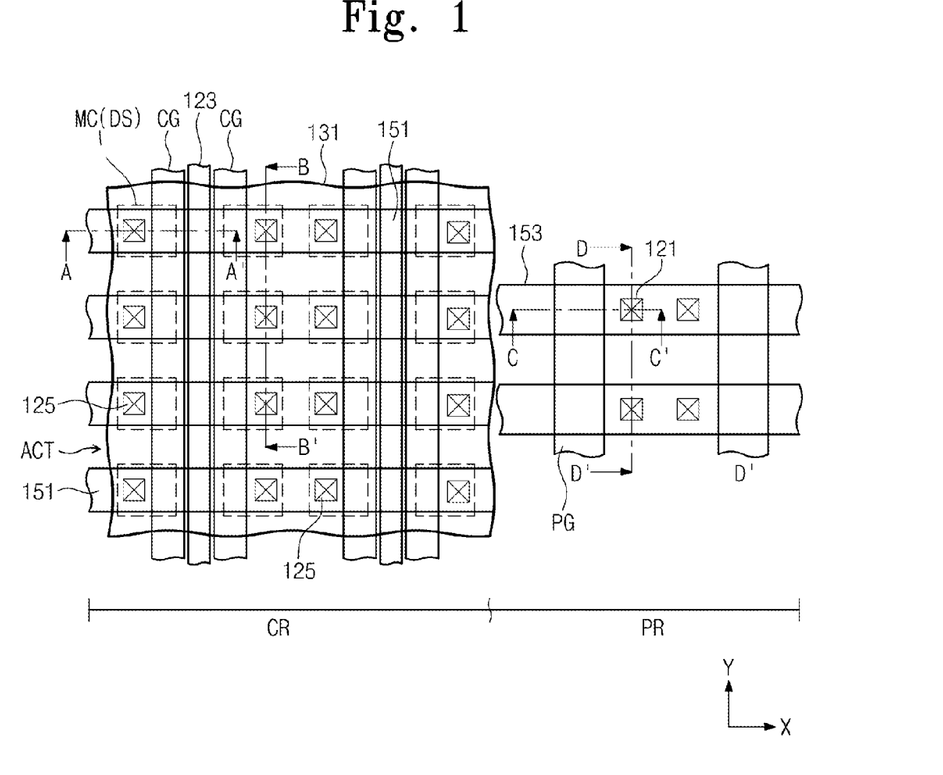
FIG. 1 is a plan view illustrating a memory device according to example embodiments.
Figure 2:
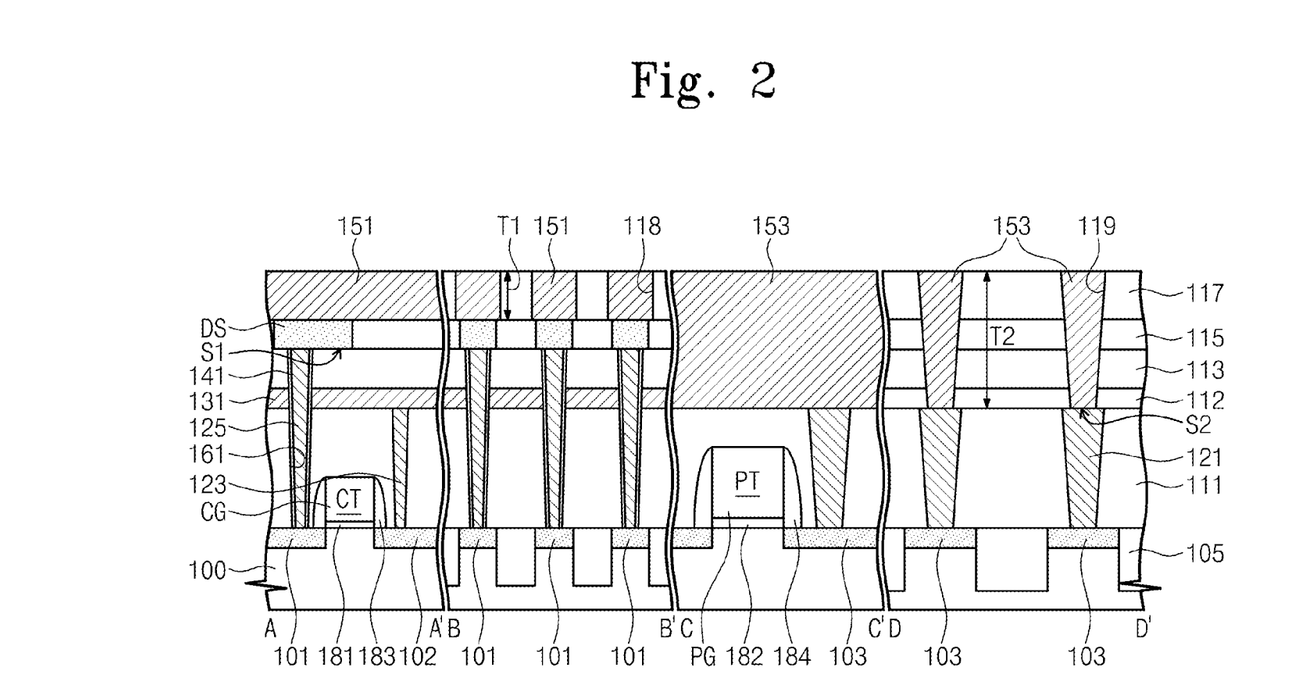
FIG. 2 is a sectional view taken along lines A-A', B-B', C-C', and D-D' of FIG. 1.

FIG. 1 is a plan view illustrating a memory device according to example embodiments. FIG. 2 is a sectional view taken along lines A-A', B-B', C-C', and D-D' of FIG. 1.

Referring to FIGS. 1 and 2, a substrate 100 may be provided to include a cell region CR and a peripheral circuit region PR. The substrate 100 may be an element containing a semiconductor material (e.g., silicon, a silicon-on-insulator (SOI), silicon germanium (SiGe), germanium (Ge), gallium arsenic (GaAs) or the like). The substrate 100 may be doped with impurities of first conductivity type. For example, the substrate 100 may be a p-type silicon wafer lightly doped with p-type impurities. Hereinafter, the cell region CR and the peripheral circuit region PR may be used to refer to portions of the substrate 100.

A plurality of memory cells MC may be provided on the cell region CR. The memory cells MC may be two-dimensionally disposed on the substrate 100. The memory cells MC may include data storages DS and switching devices. In example embodiments, the memory cells may be magnetic memory cells, each of which may include a magnetic tunnel junction (MTJ). The data storages DS will be described in more detail with reference to FIGS. 3 and 4.

The switching devices may be field effect transistors (FETs). For example, as shown in FIG. 2, cell transistors CT serving as the switching devices may be provided on the substrate 100 to include cell gate electrodes CG and source/drain regions 101 and 102. The cell transistors CT may include a gate dielectric 181 interposed between the cell gate electrodes CG and the substrate 100. In example embodiments, the gate dielectric 181 may be an oxide layer, which may be formed by thermally oxidizing the substrate 100. The cell gate electrodes CG may extend along a y direction and cross over a plurality of active regions ACT, which may be separated from each other by a device isolation layer 105. In example embodiments, the cell gate electrodes CG may include at least one of a doped semiconductor and metals. A spacer 183 may be provided on sidewalls of the cell gate electrodes CG. In example embodiments, the spacer 183 may include at least one of oxide, oxynitride layer, and nitride layer.

The source/drain regions may include second source/drain regions 101 and third source/drain regions 102. A conductive plate 131 may be provided to connect electrically the third source/drain regions 102 and cover the cell gate electrodes CG. For example, the third source/drain regions 102 of the memory cells MC may be commonly connected to the conductive plate 131. The conductive plate 131 may be spaced apart from the cell gate electrodes CG by a first interlayered dielectric 111 covering the cell gate electrodes CG. The conductive plate 131 may be shaped like a plate covering the plurality of the cell transistors CT. The conductive plate 131 may have a large planar area and thus have a reduced resistance. Accordingly, the conductive plate 131 enables (or is configured) to supply stably a reference voltage to the cell transistors CT during reading and/or programming operations. In example embodiments, the conductive plate 131 may be locally provided on the cell region CR but be not provided on the peripheral circuit region PR.

The conductive plate 131 may be formed using a conductive material. For example, the conductive plate 131 may include at least one of doped semiconductor materials, metals, conductive metal nitrides, or metal-semiconductor compounds. The conductive plate 131 may be provided in a form of single- or multi-layered structure. The first interlayered dielectric 111 may be an oxide or oxynitride layer.

The conductive plate 131 may be electrically connected to the third source/drain regions 102 via contact line patterns 123. The contact line patterns 123 may be electrically connected to the third source/drain regions 102 through the first interlayered dielectric 111. Each of the contact line patterns 123 may extend substantially parallel to the cell gate electrodes CG or along the y direction. The contact line patterns 123 may include at least one of doped semiconductor materials, metals, conductive metal nitrides, or metal-semiconductor compounds.

The data storages DS may be provided on a third interlayered dielectric 113 on the conductive plate 131. Each of the data storages DS of the memory cells MC may be spaced apart from each other by a fourth interlayered dielectric 115. Each of the data storages DS may be electrically connected to the corresponding one of the second source/drain regions 101 via the corresponding one of second contacts 125. The second contacts 125 may be provided on the second source/drain regions 101 of the memory cells MC, respectively. The second contacts 125 may be coupled to the second source/drain regions 101 via first contact holes 161 penetrating (or extending through) the first and third interlayered dielectrics 111 and 113 and the conductive plate 131. The second contacts 125 may be electrically isolated from the conductive plate 131 by a dielectric layer. For example, insulating spacers 141 may be provided between a sidewall of the first contact holes 161 and the second contacts 125. Due to the presence of the first contact holes 161, a plurality of holes may be defined in the conductive plate 131.

The second contacts 125 may include at least one of doped semiconductor materials, metals, conductive metal nitrides, or metal-semiconductor compounds. The insulating spacers 141 may be formed of oxide, nitride, or oxynitride. The third and fourth interlayered dielectric 113 and 115 may be formed of an oxide or oxynitride layer.

First bit lines 151 may be provided on the data storages DS to connect the data storages DS arranged along the x direction with each other. For example, a plurality of the data storages DS arranged along the x direction may be, in common, connected to the corresponding one of the first bit lines 151. In example embodiments, the first bit lines 151 may be provided in first trenches 118, each of which may penetrate a fifth interlayered dielectric 117 to expose the data storages DS. The first bit lines 151 may include at least one of metals or conductive metal nitrides. For example, the first bit lines 151 may include copper (Cu).

Peripheral transistors PT may be provided on the peripheral circuit region PR. Each of the peripheral transistors PT may include a peripheral gate electrode PG, a gate dielectric 182 between the peripheral gate electrode PG and the substrate 100, a spacer 184 on a sidewall of the peripheral gate electrode PG, and first source/drain regions 103 in the substrate 100. Each of the peripheral transistors PT may be greater, in occupying area in plain view, than each of the cell transistors CT.

First contacts 121 may be provided extending through the first interlayered dielectric 111 and be coupled to the first source/drain regions 103, respectively. For example, each of the first contacts 121 may be coupled to the corresponding one of the first source/drain regions 103 of the peripheral transistors PT. The first contacts 121 may have top surfaces lower than those of the second contacts 125. The first contacts 121 may be greater than the second contacts 125 in terms of diameter or width. An ohmic layer (not shown) may be provided between the first contacts 121 and the first source/drain regions 103, between the second contacts 125 and the second source/drain regions 101, and between the contact line patterns 123 and the third source/drain regions 102. The ohmic layer may include a metal semiconductor compound (e.g., metal-silicide).

Second bit lines 153 may be provided on the first contacts 121 to connect a plurality of the first contacts 121, which may be, for example, arranged along the x direction. The second bit lines 153 may be electrically connected to top surfaces of the first contacts 121, respectively, through the third, fourth and fifth interlayered dielectrics 113, 115, and 117 and a second interlayered dielectric 112 provided between the first contacts 121 and the third interlayered dielectric 113. A thickness T2 of the second bit lines 153 may be greater than a thickness T1 of the first bit lines 151. For example, the thickness T2 of the second bit lines 153 may be 1.5 times or more greater than the thickness T1 of the first bit lines 151. Bottom surfaces S2 of the second bit lines 153 may be lower than bottom surfaces S1 of the data storages DS. Top surfaces of the second bit lines 153 may be formed at the substantially same level as those of the first bit lines 151. In example embodiments, the second bit lines 153 may be shaped like a plate having an aspect ratio of 2.5 or more. The second bit lines 153 may include the substantially same material as the first bit lines 151. For example, the second bit lines 153 may include copper (Cu).

According to example embodiments, the second bit lines 153 may be formed to have a structure allowing a direct connection to the second contacts 125 without any additional contact process, as will be described in more detail regarding a fabricating method.

Figure 3:
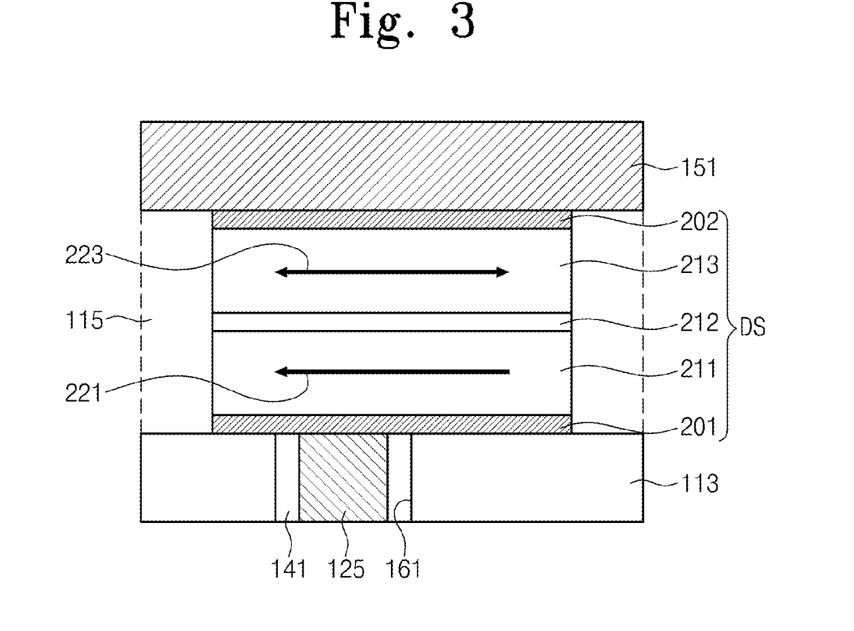
FIG. 3 is a sectional view illustrating an example of a data storage in a memory device according to example embodiments.
Figure 4:
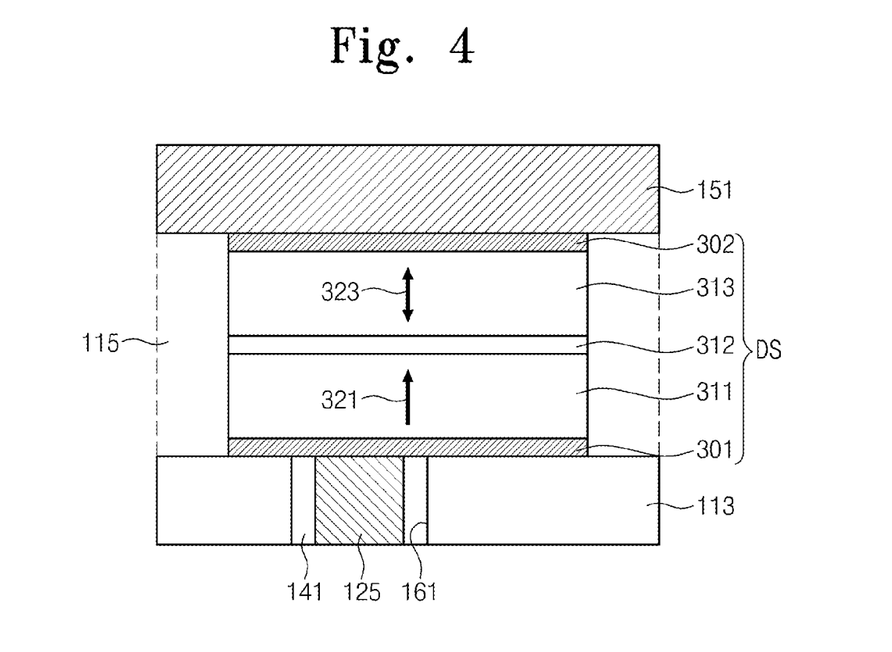
FIG. 4 is a sectional view illustrating another example of a data storage in a memory device according to example embodiments.

FIG. 3 is a sectional view illustrating an example of a data storage in a memory device according to example embodiments. FIG. 4 is a sectional view illustrating another example of a data storage in a memory device according to example embodiments.

The data storages DS will be described in more detail with reference to FIGS. 3 and 4. Referring to FIG. 3, a data storage DS according to the present example embodiments may include a reference pattern 211, a free pattern 213, and a tunnel barrier pattern 212 interposed between the reference pattern 211 and the free pattern 213. The reference pattern 211 may be configured to have a fixed magnetization direction 221, and the free pattern 213 may be configured to have a switchable magnetization direction 223 (e.g., parallel or antiparallel to the fixed magnetization direction 221 of the reference pattern 211). The magnetization directions 221 and 223 of the reference and free patterns 211 and 213 may be confined to be parallel to an interface between the tunnel barrier pattern 212 and the free pattern 213. In example embodiments, the reference pattern 211, the tunnel barrier pattern 212, and the free pattern 213 may constitute a magnetic tunnel junction (MTJ).

In the case in which the magnetization direction 223 of the free pattern 213 is parallel to the magnetization direction 221 of the reference pattern 211, the data storage DS may be in a state of a first resistance. In the case in which the magnetization direction 223 of the free pattern 213 is antiparallel to the magnetization direction 221 of the reference pattern 211, the data storage DS may be in a state of a second resistance smaller than the first resistance. The difference in resistance may be used to store binary data in the data storage DS. In example embodiments, the free pattern 213 may be configured in such a way that the magnetization direction 223 thereof can be switched using a spin torque of electric charges constituting a program current.

The reference pattern 211 and the free pattern 213 may include a ferromagnetic material. The reference pattern 211 may further include an antiferromagnetic material pinning a magnetization direction of the ferromagnetic material in the reference pattern 211. The tunnel barrier pattern 212 may include at least one of magnesium oxide, titanium oxide, aluminum oxide, magnesium-zinc oxide, or magnesium-boron oxide.

The data storage DS may further include a lower electrode 201 and an upper electrode 202. The reference pattern 211, the tunnel barrier pattern 212, and the free pattern 213 may be disposed between the lower electrode 201 and the upper electrode 202. As shown in FIG. 3, the reference pattern 211, the tunnel barrier pattern 212, and the free pattern 213 may be sequentially stacked on the lower electrode 201, and the upper electrode 202 may be disposed on the free pattern 213. Alternatively, the free pattern 213, the tunnel barrier pattern 212, and the reference pattern 211 may be sequentially stacked on the lower electrode 201. The lower electrode 201 and the upper electrode 202 may include a conductive metal nitride (e.g., titanium nitride, tantalum nitride, or tungsten nitride).

FIG. 4 is a sectional view illustrating other example of a data storage in a memory device according to example embodiments.

Referring to FIG. 4, a data storage DS according to the present example embodiments may include a vertical reference pattern 311, a vertical free pattern 313, and a tunnel barrier pattern 312 interposed between the vertical reference pattern 311 and the vertical free pattern 313. The vertical reference pattern 311 may be configured to have a fixed magnetization direction 321, and the vertical free pattern 313 may be configured to have a switchable magnetization direction 323 (e.g., parallel or antiparallel to the fixed magnetization direction 321 of the vertical reference pattern 311). Here, the magnetization directions 321 and 323 of the vertical reference and free patterns 311 and 313 may be substantially perpendicular to an interface between the vertical free pattern 313 and the tunnel barrier pattern 312.

The vertical reference and free patterns 311 and 313 may include at least one of vertical magnetic materials (e.g., CoFeTb, CoFeGd, or CoFeDy), vertical magnetic materials with L10 structure, CoPt with hexagonal-closed-packed structure, and vertical magnetic structures. In example embodiments, the vertical magnetic material with L10 structure may be at least one of L10 FePt, L10 FePd, L10 CoPd, or L10 CoPt. The vertical magnetic structure may include magnetic layers and non-magnetic layers alternatingly and repeatedly stacked on one another. For example, the vertical magnetic structure may include at least one of multilayered structures of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the stacking number. In example embodiments, the vertical reference pattern 311 may be configured to be thicker and have a coercive force greater than the vertical free pattern 313.

The tunnel barrier pattern 312 may include at least one of magnesium oxide, titanium oxide, aluminum oxide, magnesium-zinc oxide, or magnesium-boron oxide. The data storage DS may include a lower electrode 301 and an upper electrode 302. As shown, the vertical reference pattern 311, the tunnel barrier pattern 312, and the vertical free pattern 313 may be sequentially stacked on the lower electrode 301, and the upper electrode 302 may be provided on the vertical free pattern 313. Alternatively, the vertical free pattern 313, the tunnel barrier pattern 312, and the vertical reference pattern 311 may be sequentially stacked on the lower electrode 301, and the upper electrode 302 may be provided on the vertical reference pattern 311. The lower and upper electrodes 301 and 302 may be formed of a conductive metal nitride.

FIGS. 5 through 8 illustrate a method of fabricating a memory device according to example embodiments and are sectional views taken along lines A-A', B-B', C-C', and D-D' of FIG. 1.

Figure 5:
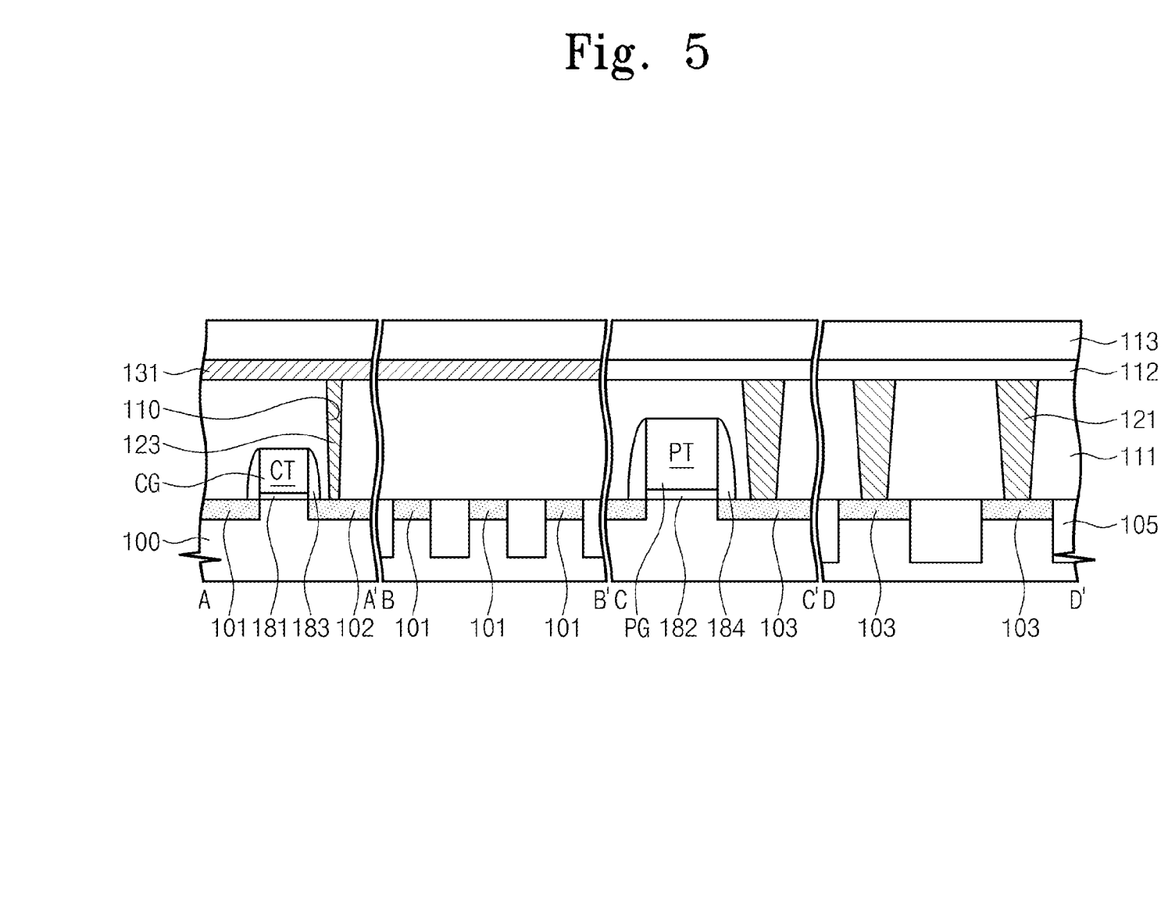
FIGS. 5 through 8 illustrate a method of fabricating a memory device according to example embodiments and are sectional views taken along lines A-A', B-B', C-C', and D-D' of FIG. 1.

Referring to FIGS. 1 and 5, the device isolation layer 105 may be formed in the substrate 100 to define active regions ACT. The device isolation layer 105 may be formed to include a trench-type device isolation pattern. In example embodiments, the formation of the device isolation layer 105 may include forming a trench in the substrate 100 and forming an insulating material to fill the trench.

The cell transistors CT and the peripheral transistors PT may be formed on the cell region CR and the peripheral circuit region PR of the substrate 100, respectively. Each of the cell transistors CT may include a cell gate electrode CG, the gate dielectric 181 between the cell gate electrode CG and the substrate 100, a spacer 183 on sidewalls of the cell gate electrode CG, and second and third source/drain regions 101 and 102 formed aligned to the cell gate electrode CG. The second and third source/drain regions 101 and 102 may be doped with dopants having a conductivity type different from, or opposite to, that of the substrate 100. Each of the peripheral transistors PT may include a peripheral gate electrode PG, a gate dielectric 182 between the peripheral gate electrode PG and the substrate 100, a spacer 184 on sidewalls of the peripheral gate electrode PG, and first source/drain regions 103 formed in the substrate 100 aligned to the peripheral gate electrode PG. In example embodiments, the first source/drain regions 103 may be doped with dopants having a conductivity type different from, or opposite to, that of the substrate 100. The first interlayered dielectric 111 may be formed to cover the cell transistors CT and the peripheral transistors PT. In example embodiments, the first interlayered dielectric 111 may be an oxide layer formed by a chemical vapor deposition.

The contact line patterns 123 may be formed to connect a plurality of the third source/drain regions 102 along the y direction. The contact line patterns 123 may be formed in third trenches 110, which may expose the third source/drain regions 102 through the first interlayered dielectric 111. The third trenches 110 may be formed substantially parallel to the cell gate electrodes CG. The formation of the third trenches 110 may include forming mask patterns (not shown) on the first interlayered dielectric 111 and then patterning the first interlayered dielectric 111 using the mask patterns as an etch mask. The formation of the contact line patterns 123 may include filling the third trenches 110 with a conductive material and then performing a planarization process until the first interlayered dielectric 111 is exposed. The contact line patterns 123 may be formed to include at least one of doped semiconductor materials, metals, conductive metal nitrides, or metal-semiconductor compounds.

The conductive plate 131 may be formed on the first interlayered dielectric 111 to cover the cell transistors CT in common. The conductive plate 131 may be locally formed on the cell region CR but not on the peripheral circuit region PR. In example embodiments, the peripheral circuit region PR may be covered with the second interlayered dielectric 112 before the formation of the conductive plate 131 and be planarized after depositing a conductive material for the conductive plate 131. The conductive plate 131 may be connected in common to the contact line patterns 123. Accordingly, some of the third source/drain regions 102 may be electrically connected to each other via the conductive plate 131. Before the formation of the second interlayered dielectric 112, an etch stop layer (not shown) may be formed on the first interlayered dielectric 111. The third interlayered dielectric 113 may be formed to cover the cell region CR and the peripheral circuit region PR. The conductive plate 131 may include at least one of doped semiconductor materials, metals, conductive metal nitrides, or metal-semiconductor compounds. In example embodiments, the third interlayered dielectric 113 may be formed of the substantially same material as the first interlayered dielectric 111.

Figure 6:
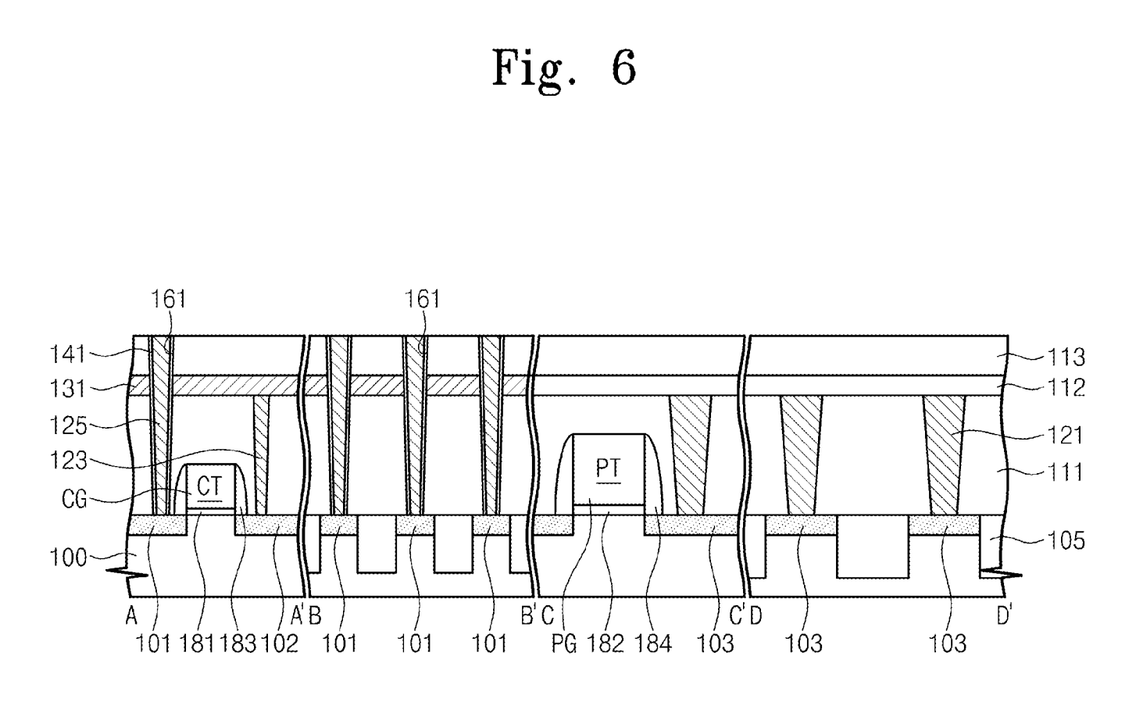

Referring to FIGS. 1 and 6, the first contact holes 161 may be formed on the cell region CR to expose the second source/drain regions 101 through the first and third interlayered dielectrics 111 and 113 as well as through the conductive plate 131. In example embodiments, the first contact holes 161 may be formed by a plurality of etching steps. As the result of the formation of the first contact holes 161, a plurality of holes may be formed through the conductive plate 131. A dielectric layer may be conformally formed on the resulting structure with the first contact holes 161. The dielectric layer may be etched to form the insulating spacers 141 exposing bottom surfaces of the first contact holes 161. Each of the insulating spacers 141 may be formed on an inner sidewall of each first contact hole 161. Each of the insulating spacers 141 may be formed to cover an entire inner sidewall of each first contact hole 161.

A conductive layer may be formed on the structure provided with the insulating spacers 141 to fill the first contact holes 161. The conductive layer may be planarized to form the second contacts 125 in the first contact holes 161, respectively. Each of the second contacts 125 may be electrically connected to the corresponding one of the second source/drain regions 101 exposed by the first contact holes 161. The second contacts 125 may be electrically isolated from the conductive plate 131 by the insulating spacers 141. The second contacts 125 may be formed to include at least one of doped semiconductor materials, metals, conductive metal nitrides, or metal-semiconductor compounds. For example, the second contacts 125 may be formed of a tungsten-containing material. The insulating spacers 141 may be formed of oxide, nitride, or oxynitride.

Figure 7:
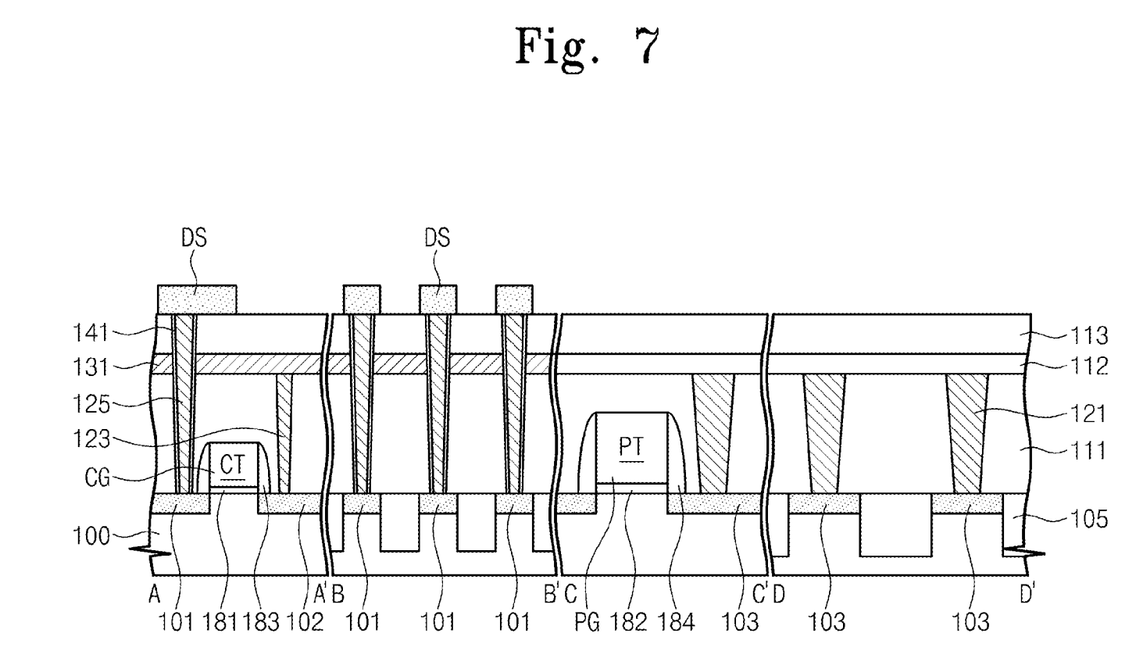

Referring to FIGS. 1 and 7, the data storages DS may be formed on the third interlayered dielectric 113. Each of the data storages DS may be directly connected to the corresponding one of the second contacts 125. The formation of the data storages DS may include forming a memory layer on the third interlayered dielectric 113 and patterning the memory layer. As the result of the pattering, the data storages DS may be two-dimensionally arranged along x and y directions. Layers and materials thereof constituting the data storages DS may be the substantially same as those in the example embodiments previously described with reference to FIGS. 3 and 4.

Figure 8:
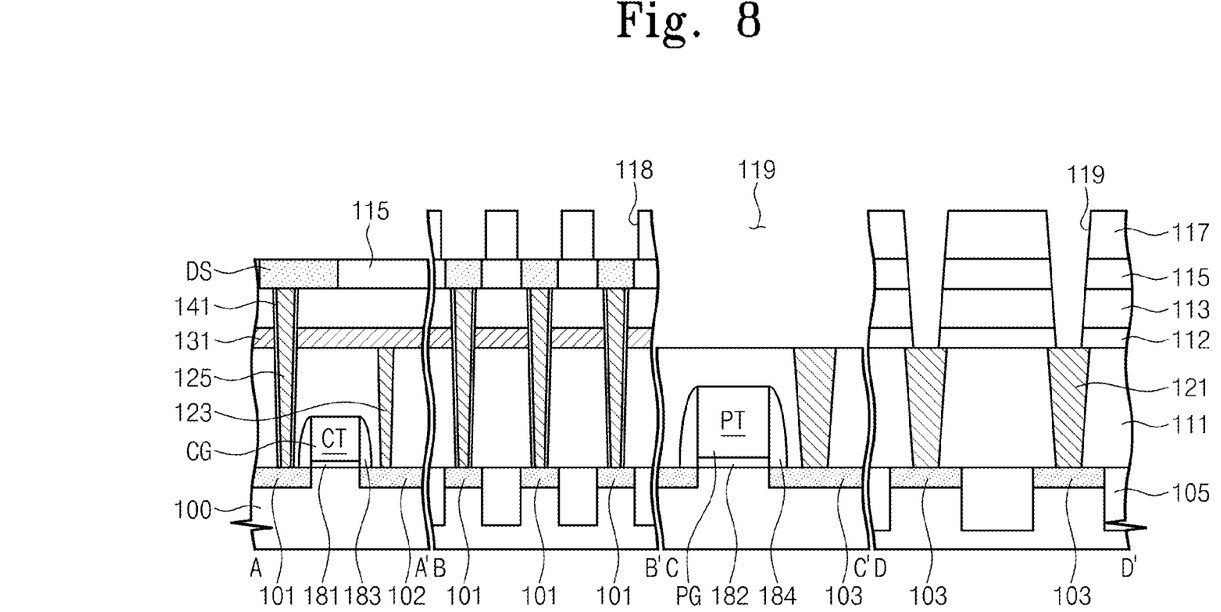

Referring to FIGS. 1 and 8, the fourth interlayered dielectric 115 may be formed on the third interlayered dielectric 113. The fourth interlayered dielectric 115 may be formed to fill a gap region between the data storages DS. The fifth interlayered dielectric 117 may be formed on the fourth interlayered dielectric 115. The fourth and fifth interlayered dielectrics 115 and 117 may be formed on both of the cell region CR and the peripheral circuit region PR.

The first trenches 118 may be formed on the cell region CR to expose the data storages DS. Each of the first trenches 118 may extend along the x direction and expose a plurality of the data storages DS arranged along the x direction. In example embodiments, a depth of each first trench 118 may be substantially equal to a thickness of the fifth interlayered dielectric 117.

The second trenches 119 may be formed on the peripheral circuit region PR to expose the first contacts 121. Each of the second trenches 119 may extend along the x direction and expose a plurality of the first contacts 121 arranged along the x direction. In example embodiments, a depth of each second trench 119 may be substantially equal to a total thickness of the second to fifth interlayered dielectrics 112, 113, 115, and 117. In other words, the second trenches 119 may be formed to be deeper than the first trenches 118. The first and second trenches 118 and 119 may be formed using etching processes distinct and different from each other. In other words, each of the first and second trenches 118 and 119 may be formed by a distinct etching process using a respective etch mask.

Referring back to FIGS. 1 and 2, the first bit lines 151 may be formed to fill the first trenches 118, and the second bit lines 153 may be formed to fill the second trenches 119. In example embodiments, the first and second bit lines 151 and 153 may be simultaneously formed using a damascene process. In other words, the formation of the first and second bit lines 151 and 153 may include forming a conductive material to fill the first and second trenches 118 and 119, and then, performing a planarization process to expose the fifth interlayered dielectric 117. The formation of the first and second bit lines 151 and 153 may be performed at process temperatures lower than that in the process of forming the first contacts 121. In example embodiments, the first and second bit lines 151 and 153 may be formed of a copper containing material.

In the case in which the first and second trenches 118 and 119 are formed through a single etching process, upper contacts should be additionally provided in order to connect the second bit lines 153 electrically with the first contacts 121, because the thickness T1 of the first bit lines 151 is equal to the thickness T2 of the second bit lines 153. However, in order to form the upper contacts, it is necessary to perform additional photolithography, etching, and deposition processes. Furthermore, in the case in which the upper contacts are formed after the formation of the data storages DS, electric characteristics of the data storages DS may be deteriorated by a high temperature process for forming the upper contacts. For example, a tungsten-containing material may be used for the upper contacts, but the process of forming the tungsten-containing material is performed at a higher temperature compared to the process of forming the copper-containing material. Alternatively, the upper contacts may be formed using copper (Cu), which can be formed at a lower temperature compared to tungsten (W), but still there is a technical difficulty in realizing contact holes of small pitch or small size, because a good gap-fill property is hard to be achieved in a copper damascene process, compared with a tungsten damascene process.

By contrast, according to example embodiments, it is possible to simplify the overall process of fabricating the device, because the additional steps for forming the upper contacts can be omitted. In addition, it is possible to prevent the memory device from being deteriorated by a high temperature process for forming contacts, because such a high temperature process can be omitted.

The memory devices disclosed above may be encapsulated using various and diverse packaging techniques. For example, the memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the memory device according to one of the above example embodiments is mounted may further include at least one semiconductor device (e.g., a controller and/or a logic device) that controls the memory device.

Figure 9:
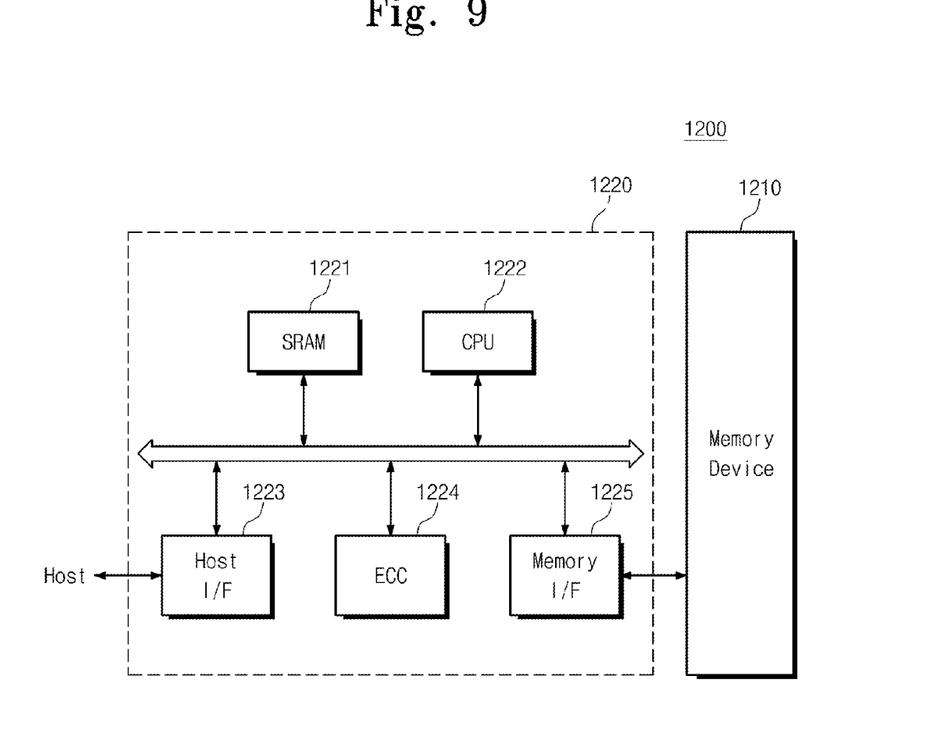
FIG. 9 is a schematic block diagram of a memory card including a memory device according to example embodiments.

FIG. 9 is a schematic block diagram illustrating an example of memory cards including a memory device according to example embodiments.

Referring to FIG. 9, a memory card 1200 according to example embodiments may include a memory device 1210. The memory device 1210 may include at least one of the memory devices according to the afore-described example embodiments. In other example embodiments, the memory device 1210 may further include another type of memory devices different from those described above. For example, the memory device 1210 may further include a nonvolatile memory device, a dynamic random access memory (DRAM) device, and/or a static RAM (SRAM) device, which may be realized based on the example embodiments. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. In example embodiments, the SRAM device 1221 may also be a memory device realized based on the example embodiments. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host.

The memory card 1200 may be used as a portable data storage card. Alternatively, the memory card 1200 may replace hard disks of computer systems as solid state disks (SSD) of the computer systems.

Figure 10:
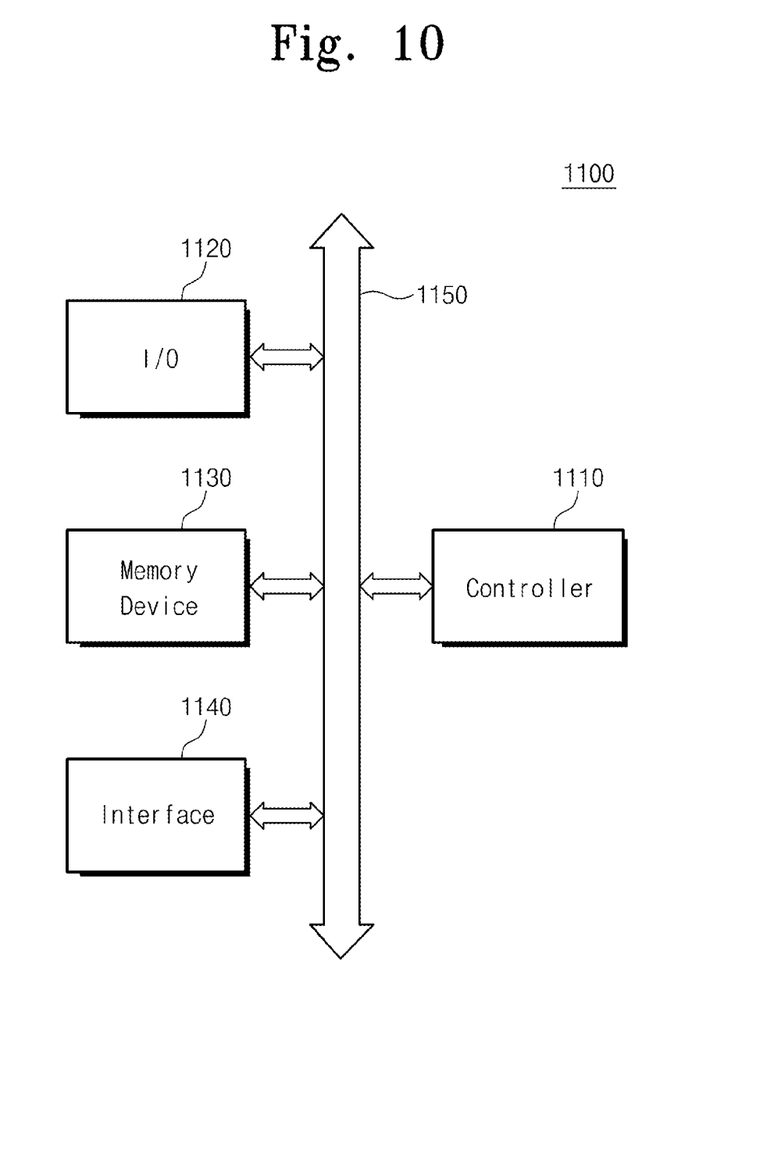
FIG. 10 is a schematic block diagram of an electronic system including a memory device according to example embodiments.

FIG. 10 is a schematic block diagram illustrating an example of electronic systems including a memory device according to example embodiments.

Referring to FIG. 10, an electronic system 1100 according to example embodiments may include a controller 1110, an input/output (I/O) unit 1120, a memory device 1130, an interface unit 1140 and a bus 1150. At least two of the controller 1110, the I/O unit 1120, the memory device 1130 and the interface unit 1140 may communicate with each other through the bus 1150. The bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the memory devices according to the afore-described example embodiments. The memory device 1130 may further include another type of memory devices different from those described above. For example, the memory device 1130 may further include a nonvolatile memory device, a magnetic memory device, a phase change memory device, a dynamic random access memory (DRAM) device, and/or a static RAM (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

According to example embodiments, provided is a simplified process enabling a reduction in the fabrication costs of memory devices and preventing data storages from being thermally deteriorated.

While example embodiments have been particularly shown and described, it will be understood by one of ordinary skill in the art that variations in form and detail may be made therein without departing from the spirit and scope of the attached claims.

What is claimed is:

1. A method of fabricating a memory device, comprising:
   forming a plurality of first contacts connected to a plurality of peripheral transistors on a substrate;
   forming a plurality of data storages two-dimensionally arranged on a cell region of the substrate;
   forming an interlayered dielectric covering uppermost surfaces of the plurality of first contacts and uppermost surfaces of the plurality of data storages;
   patterning the interlayered dielectric to form a plurality of first trenches exposing the uppermost surfaces of the plurality of data storages;
   patterning the interlayered dielectric to form a plurality second trenches exposing the uppermost surfaces of the plurality of first contacts;
   forming a plurality of first bit lines connected to the plurality of data storages in the plurality of first trenches; and
   forming a plurality of second bit lines connected to the plurality of first contacts in the plurality of second trenches,
   wherein the plurality of first trenches and the plurality of second trenches are formed using different etching processes.

2. The method of claim 1, wherein the plurality of second trenches each have a lowermost surface lower than a lowermost surface of each of the plurality of data storages.

3. The method of claim 1, wherein the plurality of first and second bit lines are formed at a process temperature lower than a process temperature used to form the plurality of first contacts.

4. The method of claim 1, wherein forming the plurality of first and second bit lines includes,
   forming a conductive layer filling the plurality of first and second trenches; and
   performing a planarization process to expose the interlayered dielectric.

5. A method of fabricating a memory device, comprising:
   forming a first contact electrically connected to a peripheral transistor in a peripheral circuit region of a substrate;
   forming a data storage in a cell region of the substrate;
   forming an interlayered dielectric layer covering uppermost surfaces of the first contact and uppermost surfaces of the data storage;
   forming a first trench exposing the uppermost surfaces of the data storage by patterning the interlayered dielectric layer only over the cell region using a first etching process;
   forming a second trench exposing the uppermost surfaces of the first contact by patterning the interlayered dielectric layer only over the peripheral circuit region using a second etching process;
   forming a first bit line connected to the data storage in the first trench; and
   forming a second bit line contacting the first contact in the second trench.

6. The method of claim 5, wherein the data storage includes a magnetic tunnel junction.

7. The method of claim 6, wherein a lowermost surface of the second bit line is lower than a lowermost surface of the magnetic tunnel junction.

8. The method of claim 6, further comprising:
   providing a cell transistor in the cell region electrically connected to the data storage via a second contact, prior to forming the data storage,
   wherein the first contact and the second contact are formed of different materials.

9. The method of claim 8, wherein the second contact is formed of a material containing tungsten.

10. The method of claim 1, wherein the plurality of peripheral transistors each include a source/drain region, and
    wherein the plurality of first contacts are each connected to the source/drain region of one of the plurality of peripheral transistors.

11. The method of claim 5, wherein the peripheral transistor includes a source/drain region, and
    wherein the first contact is connected to the source/drain region of the peripheral transistor.

12. The method of claim 2, wherein the plurality of second bit lines each have an uppermost surface that is higher than the uppermost surface of each of the plurality of data storages.

13. The method of claim 7, wherein an uppermost surface of the second bit line is higher than the uppermost surface of the data storage.

* * * * *